United States Patent
Jeong

(10) Patent No.: US 12,120,830 B2
(45) Date of Patent: Oct. 15, 2024

(54) DISPLAY APPARATUS

(71) Applicant: LG Display Co., Ltd., Seoul (KR)

(72) Inventor: Hyeontae Jeong, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 172 days.

(21) Appl. No.: 17/969,521

(22) Filed: Oct. 19, 2022

(65) Prior Publication Data

US 2023/0217602 A1 Jul. 6, 2023

(30) Foreign Application Priority Data

Dec. 30, 2021 (KR) .................. 10-2021-0191935

(51) Int. Cl.
- *H05K 5/00* (2006.01)
- *G06F 3/041* (2006.01)
- *H05K 5/02* (2006.01)
- *H05K 5/03* (2006.01)

(52) U.S. Cl.
CPC ......... *H05K 5/0018* (2022.08); *G06F 3/0412* (2013.01); *H05K 5/0217* (2013.01); *H05K 5/03* (2013.01)

(58) Field of Classification Search
CPC ........................................ H05K 5/00
See application file for complete search history.

(56) References Cited

U.S. PATENT DOCUMENTS

| | | | |
|---|---|---|---|
| 6,862,053 B2 * | 3/2005 | Lee | G02F 1/133308 349/58 |
| 7,435,914 B2 | 10/2008 | Cheng | |
| 7,570,316 B2 | 8/2009 | Kim | |
| 8,879,021 B2 | 11/2014 | Kim et al. | |
| 9,935,281 B2 | 4/2018 | Kim et al. | |
| 10,520,762 B2 | 12/2019 | Jung et al. | |
| 10,553,664 B2 | 2/2020 | Park et al. | |
| 10,943,971 B2 | 3/2021 | Park et al. | |
| 11,668,983 B2 | 6/2023 | Lim et al. | |
| 2014/0169033 A1 * | 6/2014 | Yu | H05K 5/0017 29/831 |
| 2021/0202881 A1 | 7/2021 | Kwon | |

FOREIGN PATENT DOCUMENTS

| | | |
|---|---|---|
| CN | 1983458 A | 6/2007 |
| CN | 102841462 A | 12/2012 |
| CN | 107799550 A | 3/2018 |

(Continued)

*Primary Examiner* — Jerry Wu
(74) *Attorney, Agent, or Firm* — Birch, Stewart, Kolasch & Birch, LLP

(57) ABSTRACT

A display apparatus can include a display panel to display an image, a guide holder disposed in rear of the display panel, a printed circuit board mounted on the guide holder and electrically connected to the display panel, a chip on film (COF), and a protective film. The COF can have one side electrically connected to the display panel, and another side electrically connected to the printed circuit board. A portion of the COF can be bent so as to extend across an end of the guide holder, and the protective film can be attached to one face of the guide holder and constructed to cover the COF. The guide holder can be formed at a position corresponding to a position of an end of the protective film, and can include a rib which receives a portion of the protective film.

16 Claims, 11 Drawing Sheets

(56) References Cited

FOREIGN PATENT DOCUMENTS

| | | |
|---|---|---|
| CN | 108305564 A | 7/2018 |
| CN | 109254680 A | 1/2019 |
| CN | 112820208 A | 5/2021 |
| CN | 113129745 A | 7/2021 |
| KR | 10-2006-0083268 A | 7/2006 |
| KR | 10-2007-0019358 A | 2/2007 |
| KR | 10-2008-0001512 A | 1/2008 |
| KR | 10-2016-0071533 A | 6/2016 |
| KR | 10-2019-0072876 A | 6/2019 |

\* cited by examiner

DISPLAY APPARATUS

CROSS-REFERENCE TO RELATED APPLICATION

This application claims priority to and benefit of Korean Patent Application No. 10-2021-0191935 filed on Dec. 30, 2021 in the Republic of Korea, the entire contents of which are hereby expressly incorporated by reference into the present application.

BACKGROUND OF THE DISCLOSURE

Technical Field

The present disclosure relates to a display apparatus, and more particularly, to a display apparatus having a chip on film (COF).

Description of Related Art

As the world enter a full-fledged information era, a display that visually expresses an electrical information signal has developed rapidly. In response thereto, various display apparatuses providing excellent performance, thinness, light weight, and low power consumption have been developed.

The display apparatuses include a liquid crystal display apparatus (LCD), a quantum dot (QD) display apparatus, a field emission display apparatus (FED), an electro-wetting display apparatus (EWD), an organic light-emitting display apparatus (OLED), etc.

The display apparatus can be miniaturized so that the apparatus can be carried by a user. Further, the display apparatus has been developed to be mounted on a movable apparatus such as a vehicle. Thus, the user can use the display apparatus on the vehicle more conveniently.

SUMMARY OF THE DISCLOSURE

The display apparatus can include a chip on film (COF). The chip on film can have a driver built therein for driving the display apparatus. The chip on film can be made of a thin and flexible material. Therefore, the chip on film is efficient in increasing convenience of assembly and reducing a space occupied by a component.

The chip on film can electrically connect a display panel and a printed circuit board to each other. To this end, the chip on film can disposed at a position adjacent to an edge of the display panel and can be bent. Therefore, the COF can protrude from a lower end of the display panel.

A length by which the chip on film protrudes from the lower end of the display panel, for example, a protrusion length thereof refers to a length from the lower end of the display panel to a lower end of a bent portion of the chip on film.

A protruding portion of the chip on film refers to an exposed portion thereof extending from the bottom of the display panel. Therefore, when the user looks at a front face of the display panel, a portion corresponding to the protrusion length is visible to the user. This can reduce the aesthetics of the display apparatus.

Therefore, in order to enhance the aesthetics of the display apparatus, the portion corresponding to the protruding length of the chip on film can be screened with black ink on a cover glass, and thus can become invisible to the user. This screened portion becomes a bezel.

As an area of the bezel increases, the aesthetics of the display apparatus can be lowered, and an unnecessary area of the display apparatus can increase and the practicality of the display apparatus can be lowered. Therefore, in order to reduce the area of the bezel, it is desirable to reduce the protrusion length of the chip on film as much as possible.

Further, the chip on film can be formed to be thin, and thus can be vulnerable to external impact. Therefore, for protection of the chip on film, it is desirable to minimize a size of a portion of the chip on film exposed to an outside.

A purpose of the present disclosure is to provide a display apparatus having a structure in which a size of the portion of the chip on film exposed to the outside disposed in the display apparatus is minimized.

Further, a purpose of the present disclosure is to provide a display apparatus having a protective film constructed to cover the portion of the chip on film exposed to the outside.

Purposes of the present disclosure are not limited to the above-mentioned purpose. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the claims and combinations thereof.

One embodiment of the display apparatus includes a display panel to display an image, a guide holder disposed in rear of the display panel, a printed circuit board mounted on the guide holder and electrically connected to the display panel, a chip on (COF) having one side electrically connected to the display panel, and the other side electrically connected to the printed circuit board, wherein a portion of the COF is bent so as to extend across an end of the guide holder, and a protective film attached to one face of the guide holder and constructed to cover the chip on film. The guide holder can be formed at a position corresponding to a position of an end of the protective film, and can include a rib for accommodating therein a portion of the protective film.

In one embodiment of the display apparatus of the present disclosure, the display apparatus can further include a cover glass, a touch sensor that is disposed in rear of the cover glass and disposed in front of the display panel, and recognizes a user's touch input, a polarizer that is disposed in front of the display panel, a back plate disposed in rear of the display panel, and a metal plate disposed in rear of the back plate and disposed in front of the guide holder, wherein the metal plate has a larger area than that of the guide holder.

In the display apparatus according to the present disclosure, the rib is formed at an end of the guide holder, and an end of the protective film is bent so as to be received on an inner face of the rib, so that the chip on film disposed on an inner face of the protective film can be prevented from being exposed to the outside.

Therefore, the rib allows the protective film to cover the exposed portion of the chip on film, and keeps a state in which the protective film covers the chip on film, so that the chip on film can be prevented from colliding with other parts due to external impact, and the chip on film from can be prevented from being damaged due to contact thereof with foreign materials.

Further, in the display apparatus according to the present disclosure, the rib can stably hold an end of the protective film. Thus, even when the protective film is slightly deformed due to external impact or other causes, the protective film can maintain its position while not being removed from the rib.

Accordingly, it can be effectively suppressed that the protective film is removed from the rib and thus the chip on film disposed on an inner face of the protective film is exposed to the outside.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTIONS OF THE EMBODIMENTS

Figure 1:
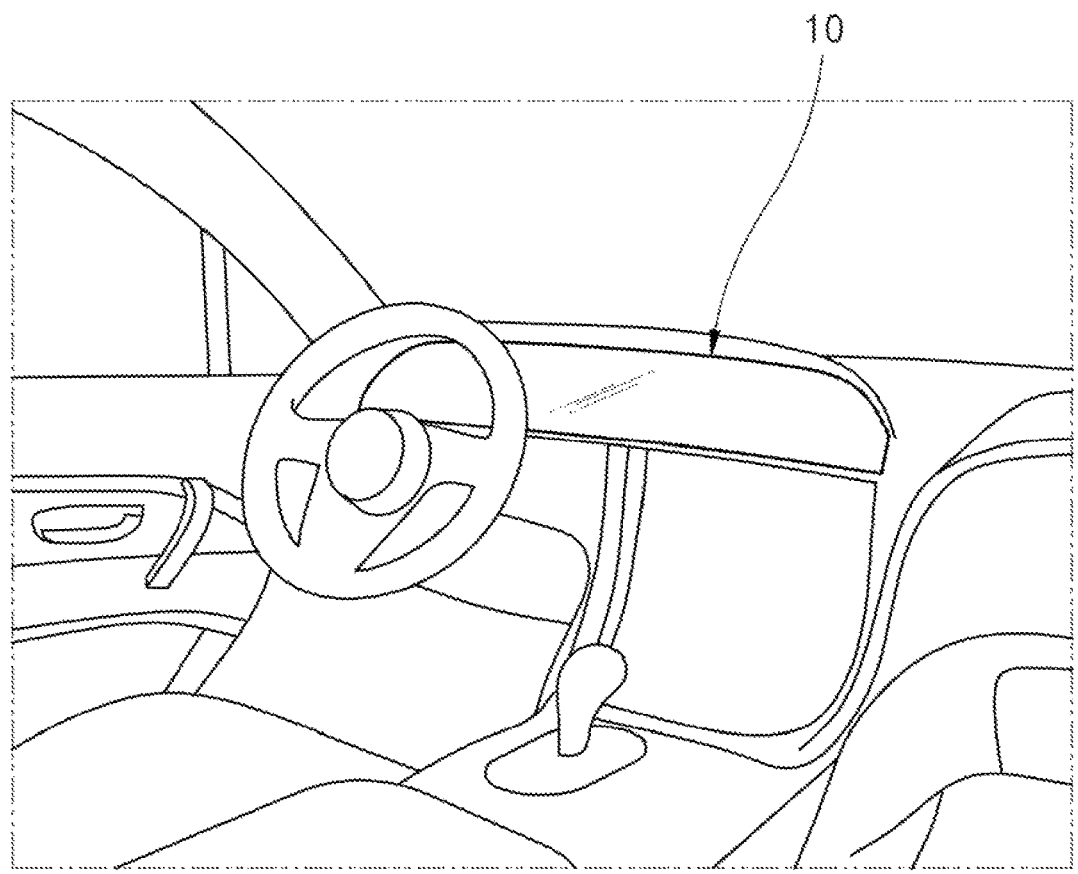
FIG. 1 shows the interior of a vehicle equipped with a display apparatus according to an embodiment of the present disclosure.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are provided to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element can unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present. In addition, it will also be understood that when a first element or layer is referred to as being present "on" or "beneath" a second element or layer, the first element can be disposed directly on or beneath the second element or can be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Spatially relative terms, such as "beneath," "below," "lower," "under," "above," "upper," and the like, can be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings can be turned over, elements described as "below" or "beneath" or "under" other elements or features would then be oriented "above" the other elements or features. Thus, the example terms "below" and "under" can encompass both an orientation of above and below. The apparatus can be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, all the components of each display apparatus according to all embodiments of the present disclosure are operatively coupled and configured.

FIG. 1 shows an interior of a vehicle equipped with a display apparatus 10 according to an embodiment of the present disclosure.

Referring to FIG. 1, the display apparatus 10 according to an embodiment can be mounted on, for example, a cockpit of a vehicle to provide an image or video necessary for a driver and a passenger of the vehicle. However, the disclosure is not limited thereto. The display apparatus may not be mounted on the vehicle but can be carried by a user. Hereinafter, for example, the display apparatus 10 mounted on the vehicle will be described.

Figure 2:
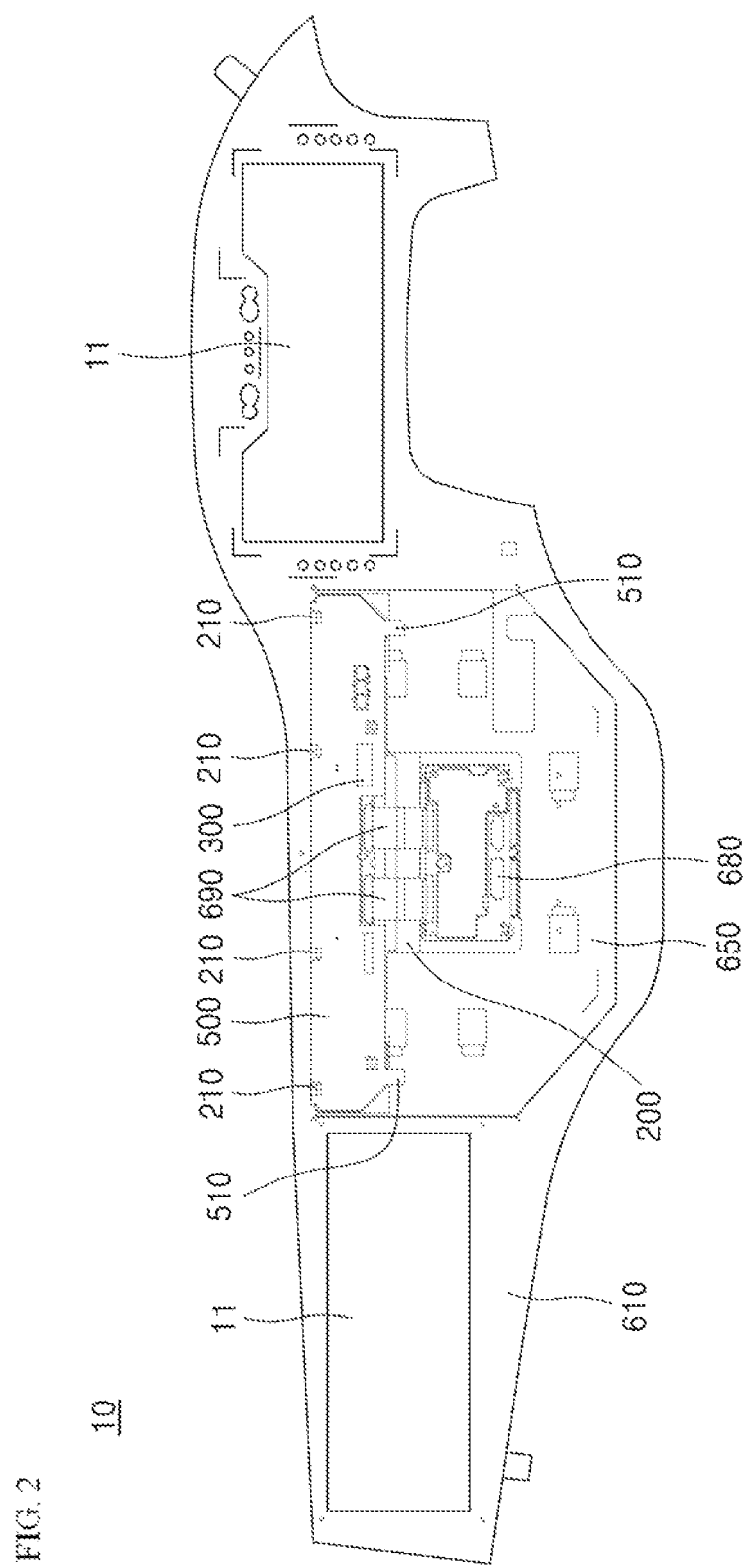
FIG. 2 is a rear view of a display apparatus according to an embodiment of the present disclosure.
Figure 3:
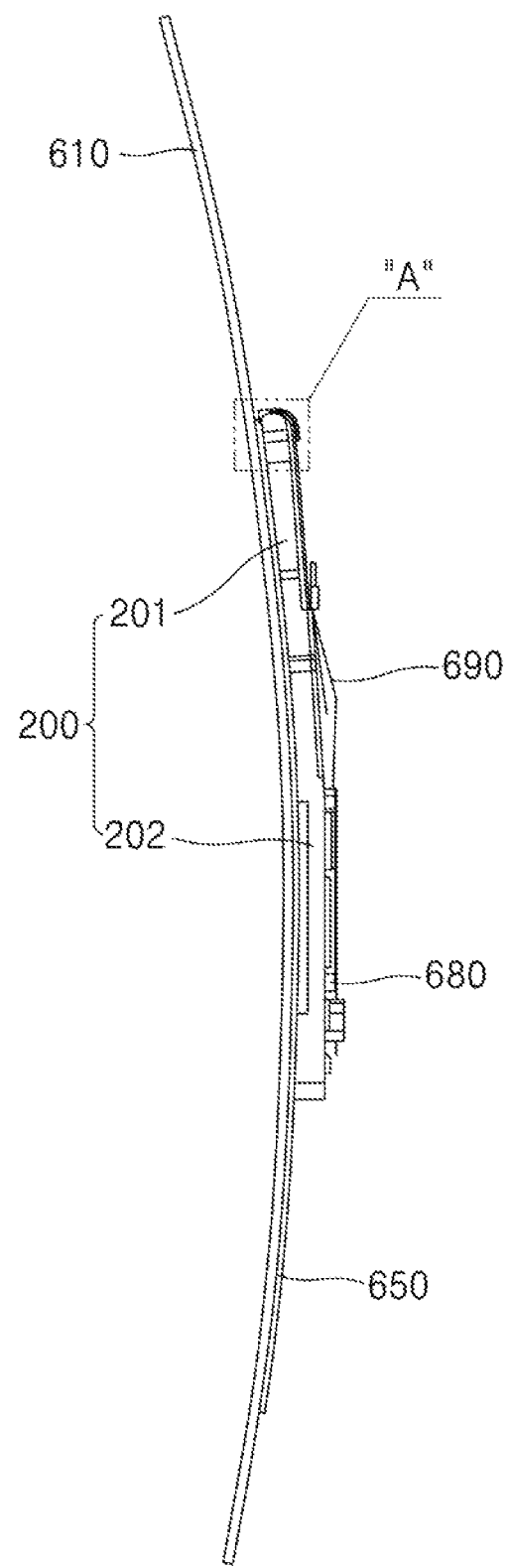
FIG. 3 is a side view of a display apparatus according to an embodiment of the present disclosure.
Figure 4:
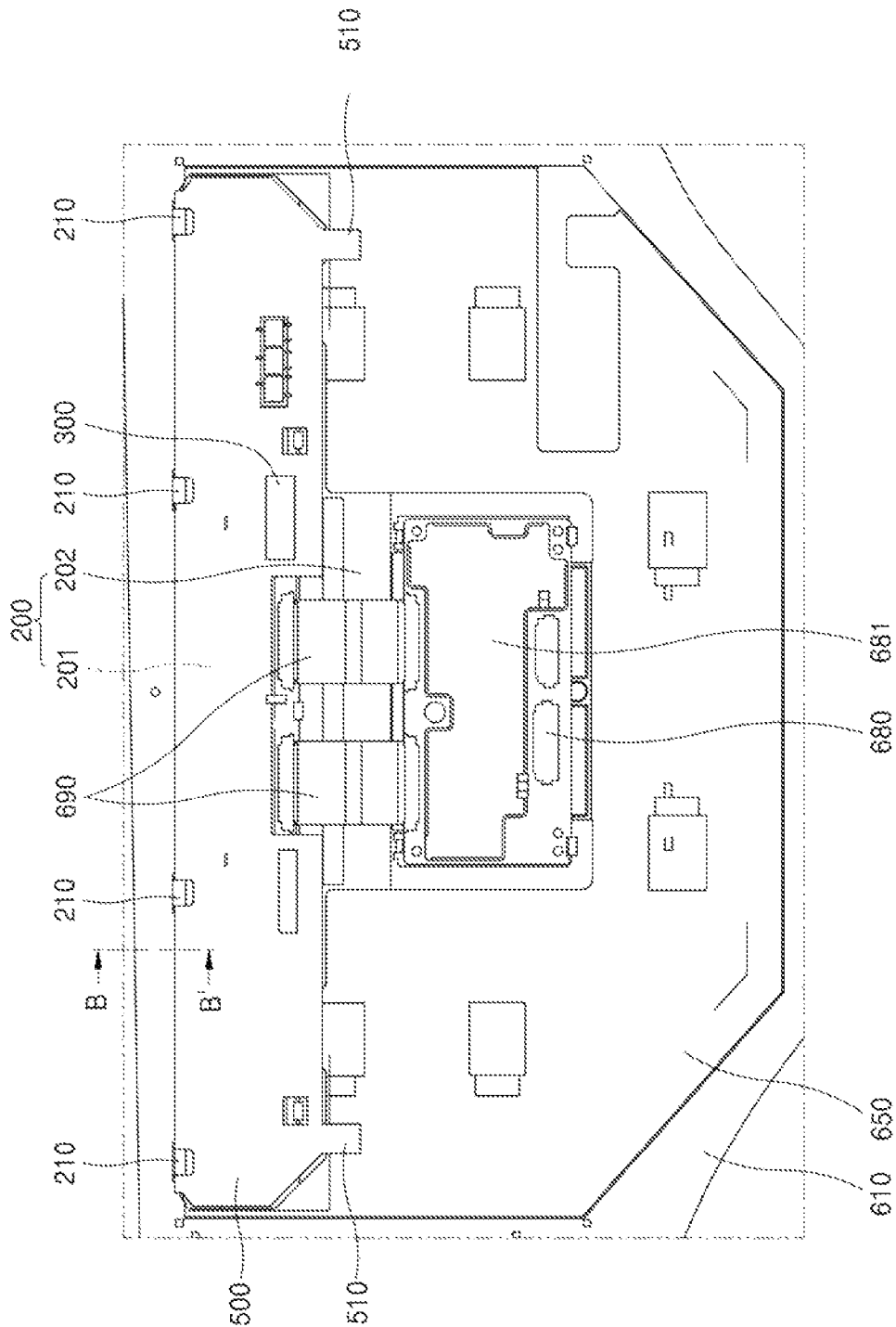
FIG. 4 is an enlarged view of a portion of FIG. 2.

FIG. 2 is a rear diagram of the display apparatus 10 according to an embodiment of the present disclosure. FIG. 3 is a side view of the display apparatus 10 according to an embodiment of the present disclosure. FIG. 4 is an enlarged view of a portion of FIG. 2.

Referring to FIGS. 2 to 4, the display apparatus 10 can have a plurality of displays mounted on one cover glass 610. Accordingly, a plurality of display mounts 11 on which not only a display panel 100 (see FIG. 7) as described below but also separate displays are respectively mounted can be disposed. Hereinafter, the display panel 100 disposed in a center region of the cover glass 610 and related parts will be mainly described.

The display apparatus 10 according to an embodiment can include the cover glass 610, the display panel 100, a guide holder 200, a printed circuit board 300, a chip on film 400 (see FIG. 7), and a protective film 500.

The cover glass 610 can be disposed in front of the display apparatus 10. The cover glass 610 can be disposed in front of the display panel 100 to protect the display panel 100. The cover glass 610 is made of a transparent material, so that light irradiated to the cover glass 610 can pass through the cover glass 610.

The display panel 100 can reproduce an image or video. The reproduced image or video can be navigation information necessary for a driver, an image captured by a camera mounted on the vehicle, or other various contents necessary for the driver or passengers.

The guide holder 200 can be disposed in rear of the display panel 100, and the printed circuit board 300 can be mounted on one face of the guide holder 200. The printed circuit board 300 can be mounted on the guide holder 200 and can be electrically connected to the display panel 100.

The printed circuit board 300 can include an apparatus for communication with an external apparatus such as a camera, a vehicle main control module, and an apparatus for driving the display panel 100 so that the display panel 100 reproduces an image or video. A circuit can be disposed in the printed circuit board, and various active and passive elements can be disposed therein.

The chip on film (COF) 400 can have one side electrically connected to the display panel 100, and the other side electrically connected to the printed circuit board 300. A portion of the COF can be bent to extend across an end of the guide holder 200.

The protective film 500 can be attached to one face of the guide holder 200 and constructed to cover the chip on film 400. The protective film 500 can cover a back face of the printed circuit board 300 connected to the chip on film 400. Therefore, the protective film 500 can prevent the chip on film 400 and the printed circuit board 300 from being exposed to the outside.

Accordingly, the protective film 500 can have an area and a shape such that the protective film 500 is capable of covering the printed circuit board 300 and the chip on film 400 connected thereto.

The protective film 500 has a form of a thin-film, and is made of a flexible material that can be bent, and can be made of a transparent, translucent, or opaque material. For example, the protective film 500 can be made of PET (polyethylene terephthalate) which can be easily workable and has excellent heat resistance. The disclosure is not limited thereto.

The display apparatus 10 can further include the metal plate 650 disposed in front of the guide holder 200 and having a larger area than that of the guide holder 200.

The metal plate 650 can be disposed in rear of the display panel 100. The metal plate 650 can be formed to be thin to produce a slim-shaped display panel. The metal plate 650 can serve as a heat sink for cooling the display panel 100 by dissipating heat generated from the display panel 100 to the outside.

The metal plate 650 can be made of a material that can be easily workable via sheet metal processing, has a high heat transfer ability, and has excellent heat resistance, for example, aluminum. However, the present disclosure is not limited thereto.

The protective film 500 can include an extended attaching portion 510 which is formed to protrude from an end of the protective film 500, and is attached to one face of the metal plate 650. The extended attaching portion 510 can attach the protective film 500 to the metal plate 650 to prevent the protective film 500 from being easily detached from a rear face of the display apparatus 10.

Further, an operator can attach the protective film 500 to the rear face of the printed circuit board 300 using the extended attaching portion 510 without crumpling the protective film 500.

The display apparatus 10 can further include a main control board 680 and a cable 690. The main control board can be mounted on the guide holder 200 and can be electrically connected to the printed circuit board 300. The main control board 680 is electrically connected to a main control module mounted on the vehicle to receive a control command from the main control module. The main control board 680 can share a role with the printed circuit board 300 and thus can control an operation of the display apparatus 10.

A second protective panel 681 can be mounted on a rear face of the main control board 680. The second protective panel 681 can be constructed to cover at least a portion of a rear face of the main control board 680 to protect the main control board 680. In one example, the second protective panel 681 can be made of a metal material and thus can act as a heat sink that transfers heat generated from the main control board 680 to the outside.

Like the printed circuit board 300, the main control board 680 can include an apparatus for driving the display panel 100 so that the display panel 100 reproduces an image or video. A circuit can be disposed in the main control board 680, and various active and passive elements can be disposed therein.

The cable 690 can electrically connect the printed circuit board 300 and the main control board 680 to each other. The cable 690 has a thin shape, is made of a flexible material, and has a plurality of conductive wires embedded therein.

The guide holder 200 is formed at a position corresponding to a position of an end of the protective film 500, and can include a rib 210 for accommodating therein a portion of the protective film 500.

The rib 210 is formed at an end of the guide holder 200. An end of the protective film is bent to be received on an inner face of the rib 210, such that the chip on film 400 disposed on an inner face of the protective film 500 can be prevented from being exposed to the outside.

Therefore, the rib 210 allows the protective film 500 to cover an exposed portion of the chip on film 400, and keeps a state in which maintain the protective film 500 covers the chip on film 400. This can effectively prevent the chip on film 400 from colliding with other parts due to external impact or can prevent the chip on film 400 from being damaged due to contact thereof with an external foreign material. A specific structure of the rib 210 will be described with reference to the drawings below.

Figure 5:
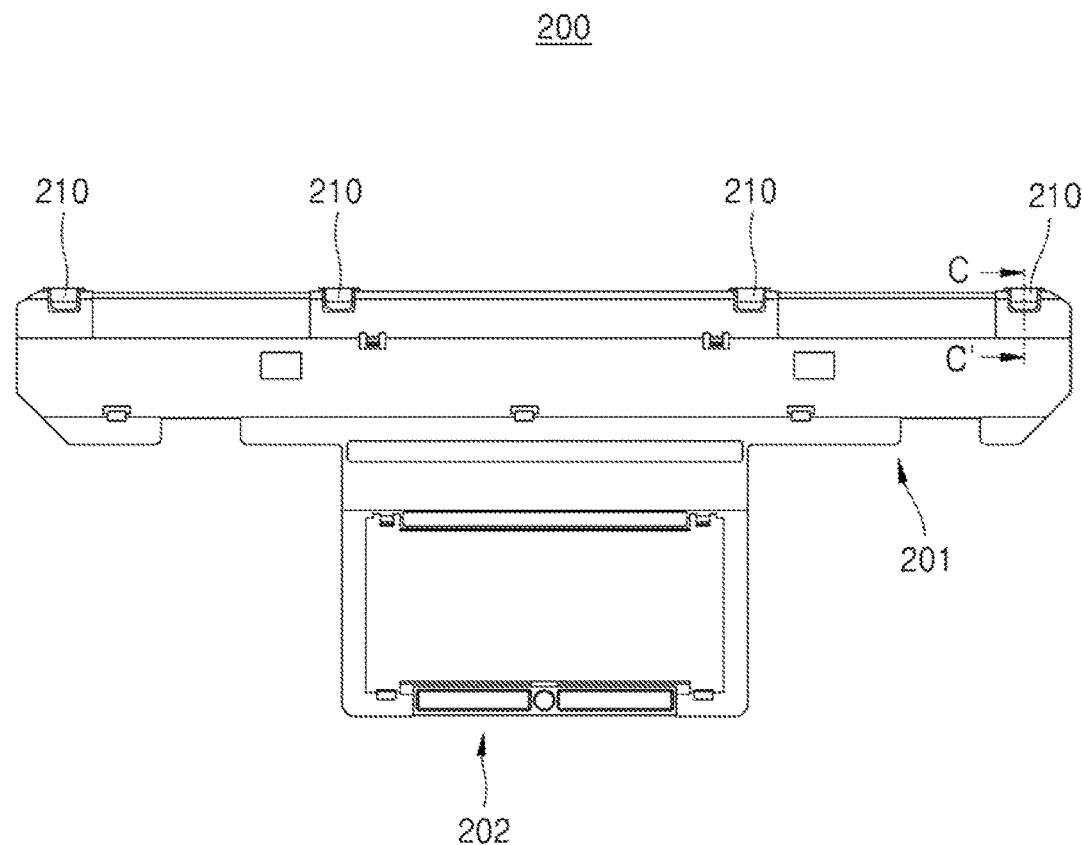
FIG. 5 is a rear view showing a guide holder according to an embodiment of the present disclosure.

FIG. 5 is a rear view showing the guide holder 200 according to an embodiment of the present disclosure.

Referring to FIG. 5, the printed circuit board 300 and the main control board 680 can be mounted on the guide holder 200. The guide holder 200 can include a first part 201 and a second part 202.

The printed circuit board 300 can be mounted on the first part 201. The protective film 500 can be disposed on the first part 201. The second part 202 can be connected to the first part 201. The main control board 680 can be mounted on the second part. The first part 201 and the second part 202 can be integrally formed with each other.

The rib 210 constructed to surround the end of the protective film 500 can be disposed at an end of the first part 201. The rib 210 can include a plurality of ribs. The ribs 210 can be spaced apart from each other.

Figure 6:
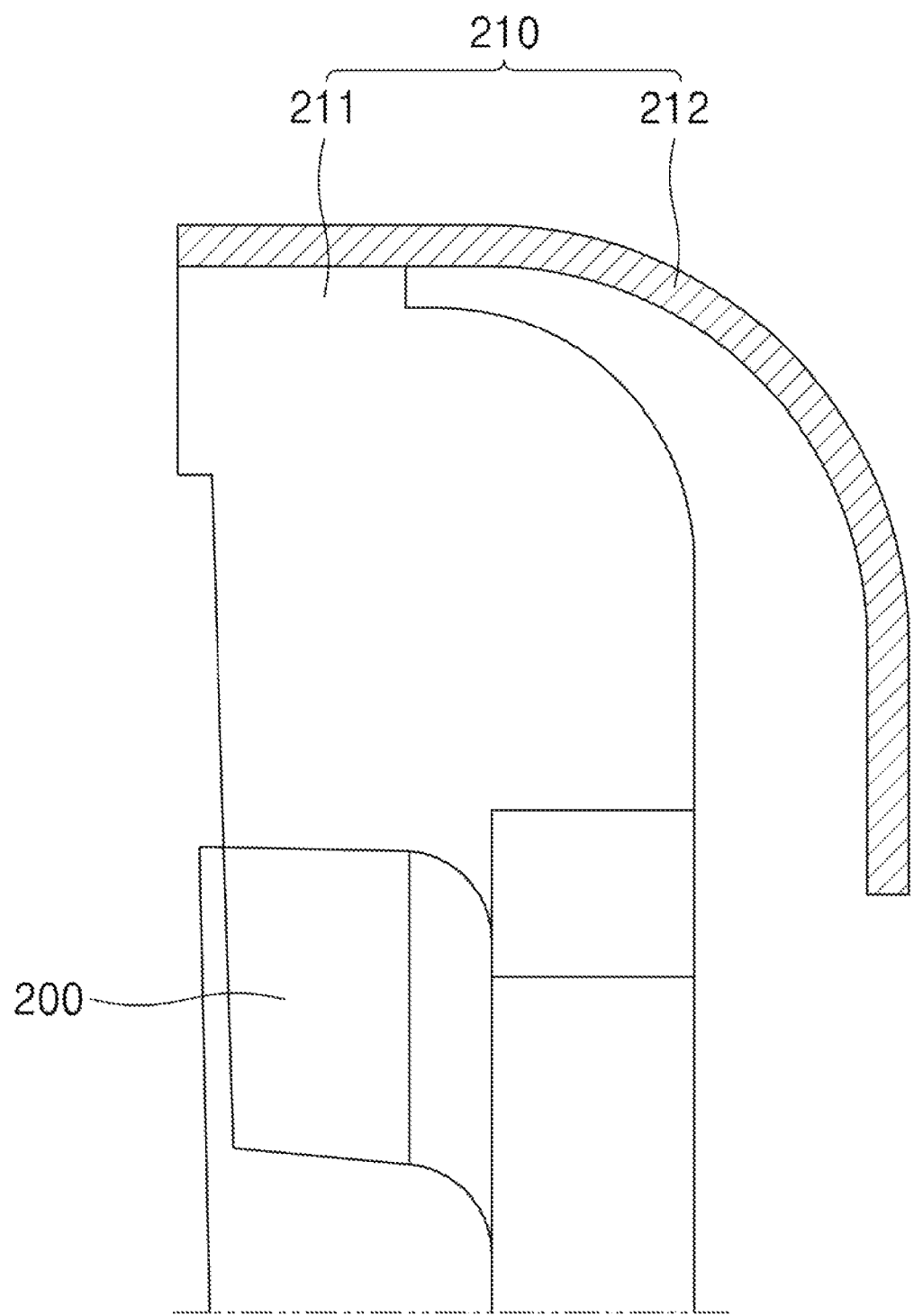
FIG. 6 is a cross-sectional view of a C-C' section in FIG. 5.

FIG. 6 is a cross-sectional view of a C-C' section in FIG. 5.

Referring to FIG. 6, the rib 210 can be formed to protrude from an end of the guide holder 200, and can be constructed to guide an end of the protective film 500 to be bent. Accordingly, in order to guide the bending of the protective film 500, the rib 210 can have a bent portion.

Specifically, the rib 210 can include a body 211 and a curved portion 212. The rib 210 can be integrally formed with the guide holder 200. Further, the body 211 and the curved portion 212 can also be integrally formed with each other.

The body 211 can be constructed to protrude from one end of the guide holder 200. The curved portion 212 can be formed to be bent from the body 211. The curved portion 212 can be bent from the body 211 into a curved shape having an appropriate curvature, and can protrude toward a rear face of the guide holder 200.

When the assembly of the display apparatus 10 is completed, an end of the protective film 500 can be received on an inner face of the curved portion 212.

Figure 7:
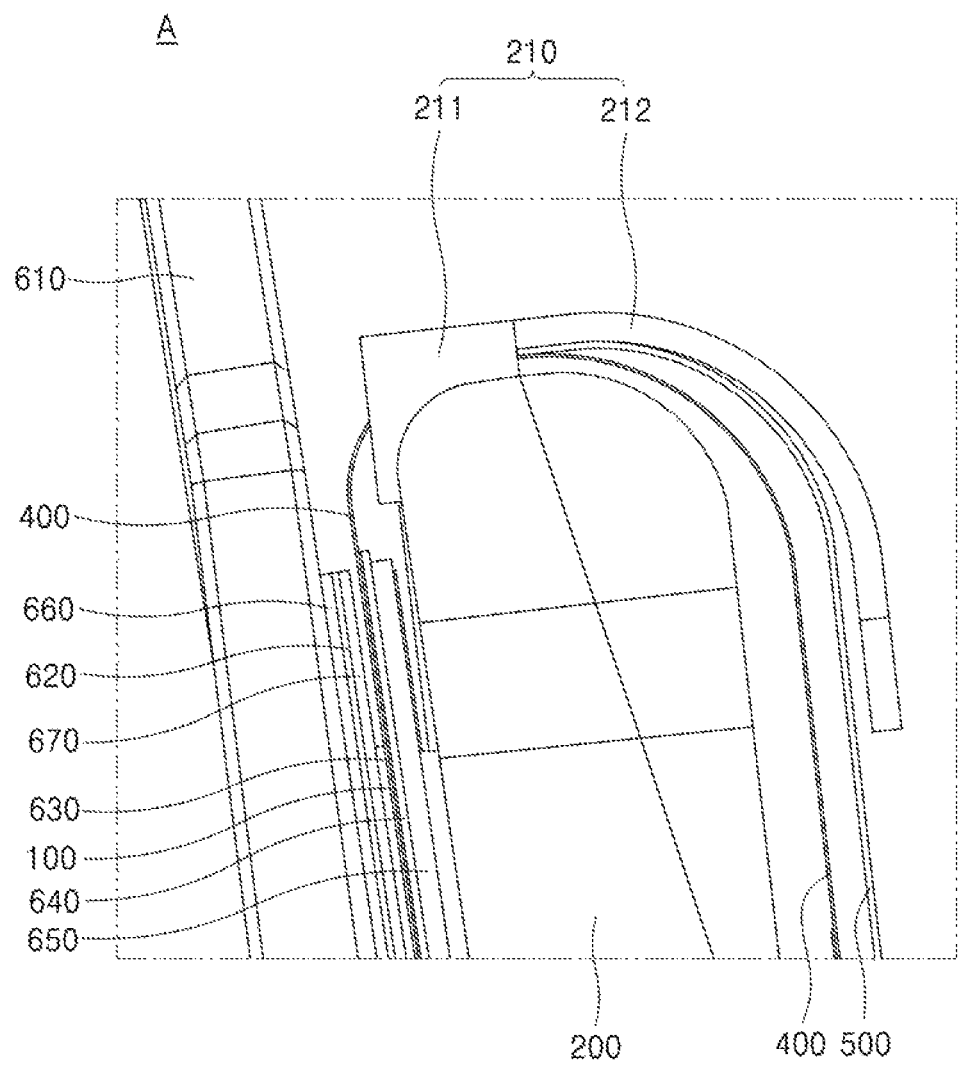
FIG. 7 is an enlarged view of a portion A of FIG. 3.
Figure 8:
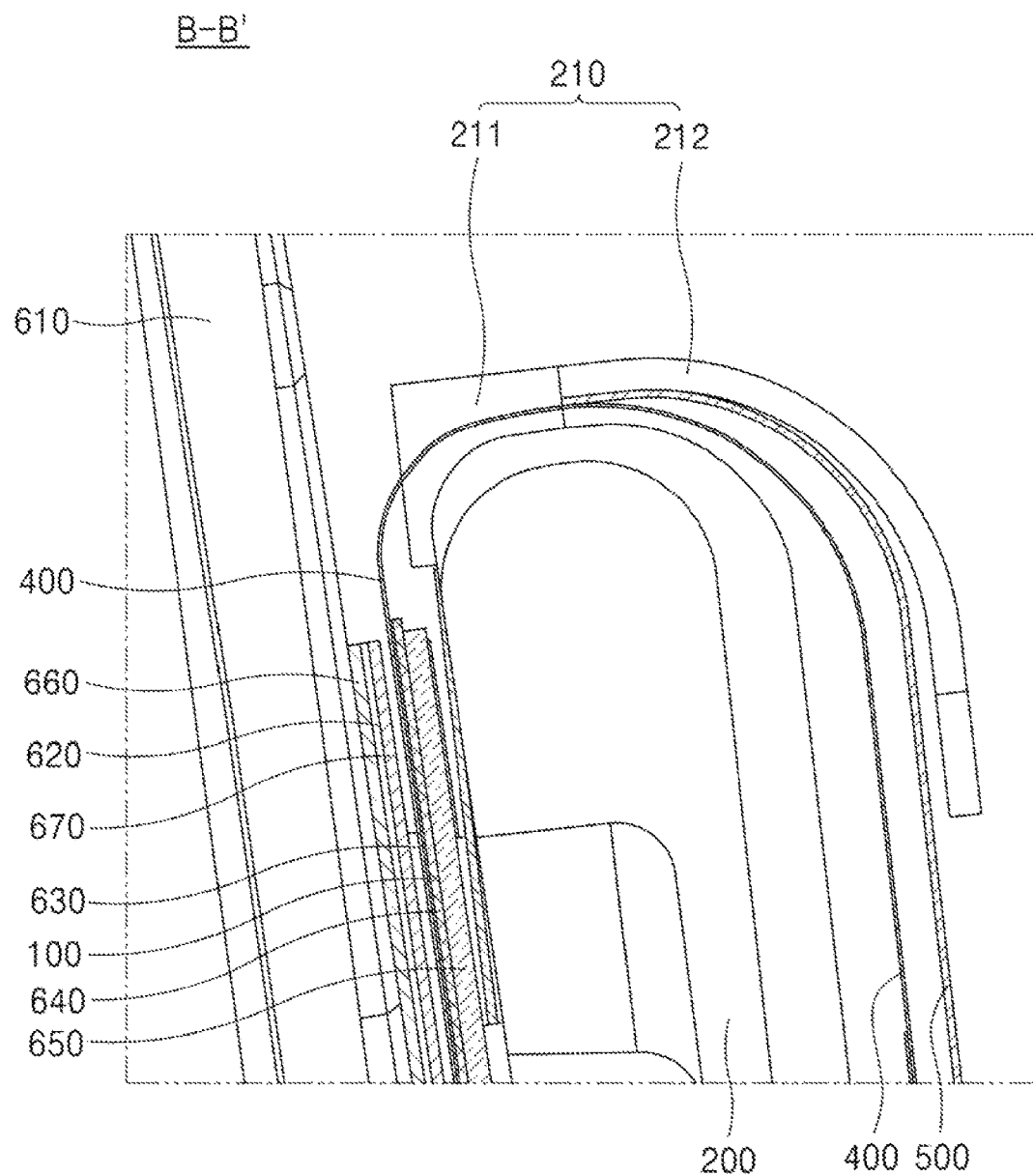
FIG. 8 is a cross-sectional view of a B-B' section in FIG. 4.

FIG. 7 is an enlarged view of a portion A of FIG. 3. FIG. 8 is a cross-sectional view of a B-B' section in FIG. 4. First, additional components of the display apparatus 10 will be described.

Referring to FIGS. 7 and 8, the display apparatus 10 according to an embodiment can further include a touch sensor 620, a first adhesive layer 660, a polarizer 630, a second adhesive layer 670, and a back plate 640. Each of these components can be formed in a thin film to produce a slim-shaped display panel.

The touch sensor 620 is disposed in rear of the cover glass 610 and disposed in front of the display panel 100, and can recognize or sense a user's touch input. The touch sensor 620 may, for example, recognize a user's input in a capacitive manner.

When a user inputs information to the cover glass 610 using a hand or a pen, the touch sensor 620 recognizes the user's input. Thus, the user can manipulate the display apparatus 10.

The first adhesive layer 660 can be disposed between the cover glass 610 and the touch sensor 620. One face of the first adhesive layer 660 can be adhered to the cover glass 610 and the other face thereof can be adhered to the touch sensor 620 to adhere the touch sensor 620 to the cover glass 610.

The polarizer 630 can be disposed in front of the display panel 100. The polarizer 630 can be disposed in front of the display panel 100 to polarize the light emitting from the display panel 100 to provide a clear image or video to the user.

The second adhesive layer 670 can be disposed between the touch sensor 620 and the polarizer 630. One face of the second adhesive layer 670 is adhered to the touch sensor 620 and the other face thereof is adhered to the polarizer 630, so that the polarizer 630 can be adhered to the display panel 100.

The back plate 640 can be disposed in rear of the display panel 100. The metal plate 650 can be disposed in rear of the back plate 640. The back plate 640 can be attached to the rear face of the display panel 100 to prevent the display panel 100 from being bent and damaged. For example, the back plate 640 can serve to reinforce the rigidity of the display panel 100.

The back plate 640 can be in a form of a film, and can be attached to the display panel 100. However, the present disclosure is not limited thereto.

The printed circuit board 300 can be mounted on a rear face of the guide holder 200. The display panel 100 can be disposed in front of the guide holder 200. Therefore, in order for the chip on film 400 to be electrically connected to the printed circuit board 300 and the display panel 100, both opposing ends of the chip on film 400 must be coupled to the printed circuit board 300 and the display panel 100, respectively.

Therefore, the chip on film 400 can extend beyond the metal plate 650 between the guide holder 200 and the display panel 100, and further, can extend across an end of the guide holder 200.

Thus, when the display apparatus 10 has been assembled, the chip on film 400 can be constructed to extend beyond the metal plate 650 and the guide holder 200 and extend across a lower end of the guide holder 200.

Accordingly, a portion of the chip on film 400 extending beyond the metal plate 650 and the guide holder 200 and corresponding to the lower end of the metal plate 650 can be bent. Further, due to this structure, the chip on film 400 can be constructed to protrude from the lower end of the metal plate 650.

The chip on film 400 and the rib 210 can be disposed at positions corresponding to each other. Accordingly, the chip on film 400 can be constructed to extend through the body 211 of the rib 210 and extend along an inner face of the curved portion 212 of the rib 210.

Due to this structure, a portion of an exposed portion of the chip on film 400 exposed to the outside can be surrounded with the rib 210.

The curved portion 212 of the rib 210 can be bent to cover at least a portion of the bent portion of the chip on film 400.

When the assembly of the display apparatus 10 has been completed, as shown in FIG. 7 and FIG. 8, a portion of the chip on film 400 in rear of the guide holder 200 can be covered with the protective film 500 and thus may not be exposed to the outside. This is because the end of the protective film 500 is disposed on an entirety of the inner face of the curved portion 212 of the rib 210.

For example, the end of the protective film 500 which is guided and bent along the curved portion 212 is disposed on the inner face of the curved portion 212.

The protective film 500 and the chip on film 400 can overlap with each other in an area corresponding to the curved portion 212, such that the exposure of the chip on film 400 to the outside can be prevented by the protective film 500.

Further, the protective film 500 can be constructed to include a portion corresponding to the curved portion 212 and in rear of the guide holder 200. Thus, the protective film 500 can cover an entirety of the chip on film 400. Therefore, a portion of the chip on film 400 disposed in rear of the guide holder 200 can be covered with the protective film 500 such that the exposure of the COF 400 to the outside can be prevented.

A portion of the protective film 500 can be bent and thus can contact at least a portion of the inner face of the curved portion 212 of the rib 210. The curved portion 212 can be spaced from a rear face of the guide holder 200. When the protective film 500 is inserted into a space between the curved portion 212 of the rib 210 and the rear face of the guide holder 200, the protective film 500 can be bent along the curved portion 212 and can come into contact with the at least a portion of the inner face of the curved portion 212. In this connection, the end of the protective film 500 can be disposed at a point where the body 211 and the curved portion 212 of the rib 210 meet each other.

Due to the above structure, the protective film 500 can entirely cover the chip on film 400 disposed in rear of the guide holder 200. Accordingly, the exposure of the chip on film 400 to the outside can be suppressed as much as possible. Thus, the chip on film 400 can be prevented from colliding with other parts due to external impact, or the chip on film 400 can be prevented from being damaged due to contact thereof with an external foreign material.

Further, the rib 210 stably holds the end of the protective film 500. Thus, even when the protective film 500 is slightly deformed due to an external shock or other causes, the protective film 500 can maintain its position while not being removed from the rib 210.

Accordingly, it can be effectively suppressed that the protective film 500 is removed from the rib 210 and thus the chip on film 400 is exposed to the outside.

Figure 9:
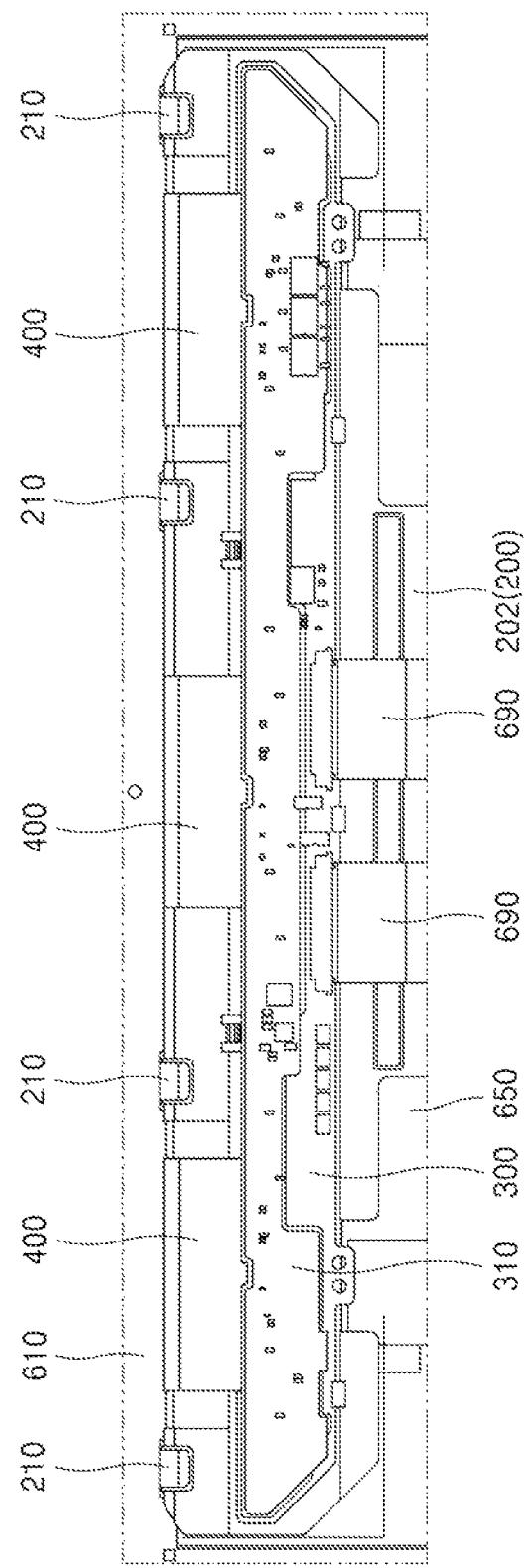
FIG. 9 is a partial view in which a protective film is omitted from a display apparatus according to one embodiment of the present disclosure.

FIG. 9 is a partial view in which the protective film 500 is omitted from the display apparatus 10 according to an embodiment of the present disclosure.

A first protective panel 310 can be mounted on a rear face of the printed circuit board 300. The first protective panel 310 can be constructed to cover at least a portion of a rear face of the printed circuit board 300 to protect the printed circuit board 300. In one example, the first protective panel 310 can be made of a metal material and can act as a heat sink that transfers heat generated from the printed circuit board 300 to the outside.

As shown in FIG. 9, the rib 210 can include a plurality of ribs. The ribs 210 can be constructed to be spaced apart from each other by a predetermined distance and can be disposed at an end of the guide holder 200.

When the number of the ribs 210 is large, the ribs 210 can hold the protective film 500 more stably, thereby effectively preventing the protective film 500 from being removed from the rib 210 and thus the exposure of the chip on film 400 to the outside.

However, when the number of the ribs 210 is too large, it can be difficult to mount the protective film 500 on the ribs 210. While considering these advantages and disadvantages, the number of ribs 210 can be appropriately selected.

The chip on film (COF) 400 can include a plurality of COFs. In this regard, each of the chip on films 400 can be disposed at a position other than positions of the plurality of the ribs 210. For example, each of the COFs 400 can be disposed at a position non-corresponding to a position of each of the plurality of the ribs 210. In order that both opposing ends of the chip on film 400 are connected to the printed circuit board 300 and the display panel 100, respectively, the positions of the chip on film 400 and the rib 210 are spaced apart from each other in a lateral direction of the display apparatus 10.

For example, as shown in FIG. 9, the chip on film 400 and the rib 210 can be alternately arranged with each other in a lateral direction of the guide holder 200. However, the disclosure is not limited thereto.

Figure 10:
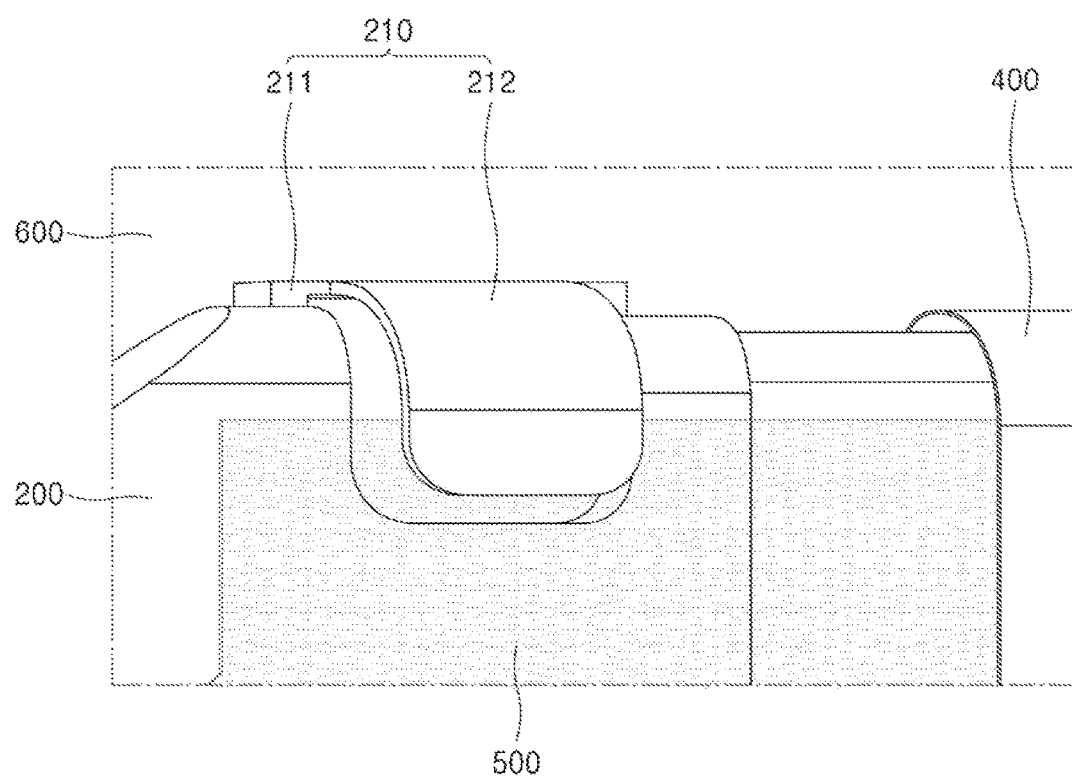
FIG. 10 is a partial view showing a process of mounting a protective film on a display apparatus according to an embodiment of the present disclosure.
Figure 11:
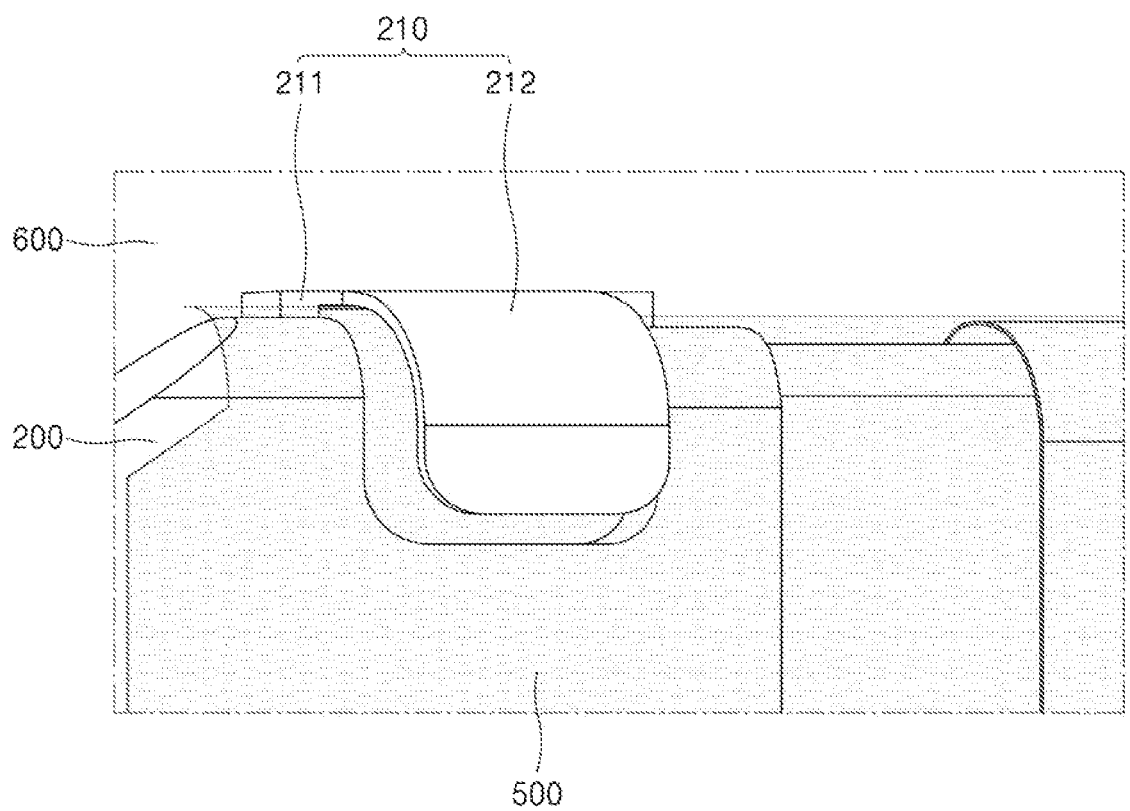
FIG. 11 is a view showing a state in which the protective film has been mounted thereon in FIG. 10.

FIG. 10 is a partial view showing a process in which the protective film 500 is mounted on the display apparatus 10 according to an embodiment of the present disclosure. FIG. 11 is a view showing a state in which the protective film 500 has been mounted thereon in FIG. 10.

A process of mounting the protective film 500 onto the display apparatus 10 can be performed in a following order. As shown in FIG. 10, an operator can insert an end of the protective film 500 into a gap formed by a rear face of the guide holder 200 and the curved portion 212 of the rib 210 which are spaced apart from each other.

After the end of the protective film 500 has been inserted into the gap, the protective film 500 is pushed toward the rib 210. Thus, the end of the protective film 500 is guided and bent by the curved portion 212 and then moves forward toward the body 211 of the rib 210.

When a tip of the protective film 500 touches the point where the body 211 and the curved portion 212 of the rib 210 meet each other, the protective film 500 does not move forward. In this state, when the operator attaches the protective film 500 to the rear face of the printed circuit board 300 and the rear face of the metal plate 650, the installation of the protective film 500 can be completed. FIG. 11 shows the complete installed state of the protective film 500.

A display apparatus according to an embodiment of the present disclosure can be described as follows.

A display apparatus includes a display panel for displaying an image; a guide holder disposed in rear of the display panel; a printed circuit board mounted on the guide holder and electrically connected to the display panel; a chip on film (COF) having one side electrically connected to the display panel, and the other side electrically connected to the printed circuit board, wherein a portion of the COF is bent so as to extend across an end of the guide holder; and a protective film attached to one face of the guide holder and constructed to cover the chip on film, wherein the guide holder is formed at a position corresponding to a position of an end of the protective film, and includes a rib which receives a portion of the protective film.

In one implementation, the rib is formed to protrude from an end of the guide holder, and is constructed to guide an end of the protective film to be bent.

In one implementation, the rib includes a plurality of ribs, wherein the ribs are spaced apart from each other by a predetermined distance and are disposed at an end of the guide holder.

In one implementation, the chip on film (COF) includes a plurality of COFs, wherein each of the COFs disposed at a position non-corresponding to a position of each of the plurality of the ribs.

In one implementation, the rib includes: a body constructed to protrude from one end of the guide holder; and a curved portion formed to be bent from the body, wherein a portion of the protective film is bent and contacts at least a portion of an inner face of the curved portion, wherein the curved portion is spaced from a rear face of the guide holder.

In one implementation, the curved portion is bent to cover at least a portion of a bent portion of the chip on film.

In one implementation, the protective film is made of a PET (polyethylene terephthalate) material.

In one implementation, the display apparatus further comprises: a cover glass; a touch sensor disposed in rear of the cover glass and disposed in front of the display panel and configured to sense a touch input from a user; a polarizer disposed in front of the display panel; a back plate disposed in rear of the display panel; and a metal plate disposed in rear of the back plate and disposed in front of the guide holder, wherein the metal plate has a larger area than an area of the guide holder.

In one implementation, the protective film has an extended attaching portion formed to protrude from an end of the protective film, wherein the attaching portion is attached to one face of the metal plate.

In one implementation, the display apparatus further comprises: a first adhesive layer disposed between the cover glass and the touch sensor; and a second adhesive layer disposed between the touch sensor and the polarizer.

In one implementation, the display apparatus further comprises: a main control board mounted on the guide holder and electrically connected to the printed circuit board; and a cable for electrically connecting the printed circuit board and the main control board to each other.

In one implementation, the guide holder includes: a first part on which the printed circuit board is mounted, wherein the protective film is disposed on the first part; and a second part connected to the first part, wherein the main control board is mounted on the second part.

The features, the structures, the effects, etc. as described in the examples of the present application as described above are included in at least one example of the present disclosure, and are not necessarily limited to only one example. Furthermore, the features, the structures, the effects, etc. illustrated in at least one example of the present disclosure can be combined with each other or modified in other examples by those of ordinary skill in the art to which the present application belongs. Therefore, the combinations and the modifications should be interpreted as being included in the scope of the present disclosure.

The present disclosure as described above is not limited to the above-described embodiments and the accompanying drawings. It will be apparent to those of ordinary skill in the technical field to which the present disclosure belongs that various substitutions, modifications and changes can be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A display apparatus comprising: a display panel configured to display an image; a guide holder disposed on a rear surface of the display panel; a printed circuit board mounted on the guide holder and electrically connected to the display panel; a chip on film (COF) having one side electrically connected to the display panel, and another side electrically connected to the printed circuit board, wherein a portion of the COF is bent so as to extend across an end of the guide holder; and a protective film attached to one face of the guide holder and constructed to cover the COF, wherein the guide holder is formed at a position corresponding to a position of an end of the protective film, and includes a rib which receives a portion of the protective film; and the rib is formed to protrude from an end of the guide holder, and is constructed to guide an end of the protective film to be bent; and the rib includes a body constructed to protrude from one end of the guide holder; and a curved portion formed to be bent from the body, wherein a portion of the protective film is bent and contacts at least a portion of an inner face of the curved portion, and wherein the curved portion is spaced from a rear face of the guide holder opposite to the rear surface.

2. The display apparatus of claim 1, wherein the rib includes a plurality of ribs, and
    wherein the plurality of ribs are spaced apart from each other by a predetermined distance and are disposed at an end of the guide holder.

3. The display apparatus of claim 2, wherein the COF includes a plurality of COFs,
    wherein each of the COFs is disposed at a position non-corresponding to a position of each of the plurality of the ribs.

4. The display apparatus of claim 1, wherein the curved portion is bent to cover at least a portion of a bent portion of the COF.

5. The display apparatus of claim 1, wherein the protective film is made of a PET (polyethylene terephthalate) material.

6. The display apparatus of claim 1, further comprising:
a cover glass;
a touch sensor disposed in rear of the cover glass and disposed in front of the display panel and configured to sense a touch input from a user;
a polarizer disposed in front of the display panel;
a back plate disposed in rear of the display panel; and
a metal plate disposed in rear of the back plate and disposed in front of the guide holder, wherein the metal plate has a larger area than an area of the guide holder.

7. The display apparatus of claim 6, wherein the protective film has an extended attaching portion formed to protrude from an end of the protective film, and the attaching portion is attached to one face of the metal plate.

8. The display apparatus of claim 7, further comprising:
a first adhesive layer disposed between the cover glass and the touch sensor; and
a second adhesive layer disposed between the touch sensor and the polarizer.

9. The display apparatus of claim 6, further comprising:
a main control board mounted on the guide holder and electrically connected to the printed circuit board; and
a cable for electrically connecting the printed circuit board and the main control board to each other.

10. The display apparatus of claim 9, wherein the guide holder includes:
a first part on which the printed circuit board is mounted, wherein the protective film is disposed on the first part; and
a second part connected to the first part, wherein the main control board is mounted on the second part.

11. The display apparatus of claim 10, wherein the rib is constructed to surround an end of the protective film and is disposed at an end of the first part.

12. The display apparatus of claim 6, wherein the COF is constructed to protrude from a lower end of the metal plate.

13. The display apparatus of claim 1, wherein an end of the protective film is disposed on an entirety of the inner face of the curved portion.

14. The display apparatus of claim 1, wherein the protective film and the COF overlap with each other in an area corresponding to the curved portion.

15. The display apparatus of claim 1, wherein an end of the protective film is disposed at a point where the body and the curved portion meet each other.

16. The display apparatus of claim 1, wherein the COF is constructed to extend through the body and extend along the inner face of the curved portion.

* * * * *